(12) United States Patent
Han et al.

(10) Patent No.: US 9,312,171 B2
(45) Date of Patent: Apr. 12, 2016

(54) SEMICONDUCTOR DEVICES HAVING THROUGH-ELECTRODES AND METHODS FOR FABRICATING THE SAME

(71) Applicant: Samsung Electronics Co., Ltd., Suwon-si (KR)

(72) Inventors: Kyu-Hee Han, Hwaseong-si (KR); Pil-Kyu Kang, Anyang-si (KR); Taejin Yim, Yongin-si (KR); Naein Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/490,964

(22) Filed: Sep. 19, 2014

(65) Prior Publication Data

US 2015/0155233 A1 Jun. 4, 2015

(30) Foreign Application Priority Data

Nov. 29, 2013 (KR) .......................... 10-2013-0147475

(51) Int. Cl.
*H01L 23/48* (2006.01)
*H01L 21/768* (2006.01)
*H01L 23/532* (2006.01)

(52) U.S. Cl.
CPC ........ *H01L 21/76879* (2013.01); *H01L 23/481* (2013.01); *H01L 23/5329* (2013.01); *H01L 2924/0002* (2013.01)

(58) Field of Classification Search
CPC .............. H01L 23/5226; H01L 23/481; H01L 23/49827
See application file for complete search history.

(56) References Cited

U.S. PATENT DOCUMENTS

| | | | |
|---|---|---|---|
| 6,589,890 B2 | 7/2003 | Cohen et al. | |
| 7,842,518 B2 | 11/2010 | Miyajima | |
| 8,058,183 B2 | 11/2011 | Cui et al. | |
| 8,164,165 B2 | 4/2012 | Chang et al. | |
| 8,546,256 B2 | 10/2013 | Jung et al. | |
| 8,637,353 B2 | 1/2014 | Abou-Khalil et al. | |
| 2008/0045025 A1 | 2/2008 | Asako et al. | |
| 2009/0321945 A1 | 12/2009 | Besling | |
| 2011/0089572 A1 | 4/2011 | Tezcan et al. | |
| 2011/0101538 A1* | 5/2011 | Ponoth et al. | 257/774 |
| 2012/0094437 A1* | 4/2012 | Han et al. | 438/109 |
| 2012/0181694 A1* | 7/2012 | Usami et al. | 257/751 |
| 2012/0199970 A1* | 8/2012 | Yun et al. | 257/737 |
| 2013/0234336 A1* | 9/2013 | Richter et al. | 257/774 |
| 2014/0191400 A1* | 7/2014 | Chien et al. | 257/751 |
| 2014/0217603 A1* | 8/2014 | Moon et al. | 257/774 |
| 2014/0252622 A1* | 9/2014 | Peng et al. | 257/751 |
| 2015/0069608 A1* | 3/2015 | Collins et al. | 257/741 |
| 2015/0137325 A1* | 5/2015 | Hong et al. | 257/621 |

FOREIGN PATENT DOCUMENTS

JP 2011040457 2/2011

* cited by examiner

*Primary Examiner* — Nathan Ha
(74) *Attorney, Agent, or Firm* — Myers Bigel & Sibley, P.A.

(57) ABSTRACT

The present inventive concepts provide semiconductor devices and methods for fabricating the same. The method includes forming an inter-metal dielectric layer including a plurality of dielectric layers on a substrate, forming a via-hole vertically penetrating the inter-metal dielectric layer and the substrate, providing carbon to at least one surface, such as a surface including carbon in the plurality of dielectric layers exposed by the via-hole, forming a via-dielectric layer covering an inner surface of the via-hole, and forming a through-electrode surrounded by the via-dielectric layer in the via-hole.

20 Claims, 21 Drawing Sheets ll
SEMICONDUCTOR DEVICES HAVING THROUGH-ELECTRODES AND METHODS FOR FABRICATING THE SAME

CROSS-REFERENCE TO RELATED APPLICATION

This application claims the benefit of and priority under 35 U.S.C. §119 to Korean Patent Application No. 10-2013-0147475, filed on Nov. 29, 2013, the disclosure of which is hereby incorporated herein by reference in its entirety.

BACKGROUND

The present inventive concepts relate to a semiconductor and, more particularly, to semiconductor devices having through-electrodes and methods for fabricating the same.

Through-electrodes penetrating a substrate may be used to electrically connect a semiconductor device to another semiconductor device or a printed circuit board. Through-electrodes may be used for a three-dimensional mounting technique and may provide a faster data transmitting speed as compared with conventional solder balls or solder bumps. New formation processes and new structures for through-electrodes may be desired to improve electrical characteristics of semiconductor devices.

SUMMARY

Embodiments of the present inventive concepts may provide semiconductor devices capable of preventing through-electrodes from being damaged by formation processes of the through-electrodes and methods for fabricating the same.

In some embodiments, the method may include: forming an inter-metal dielectric layer including a plurality of dielectric layers on a substrate; forming a via-hole vertically penetrating the inter-metal dielectric layer and the substrate; providing carbon to at least one surface exposed by the via-hole; forming a via-dielectric layer covering an inner surface of the via-hole; and forming a through-electrode surrounded by the via-dielectric layer in the via-hole. In some embodiments, the at least one surface includes a surface of a layer of the plurality of dielectric layers including carbon.

In some embodiments, forming the inter-metal dielectric layer may include alternately stacking a capping layer and a low-k dielectric layer on the substrate. The low-k dielectric layer may have a dielectric constant lower than that of silicon dioxide. In some embodiments, the inter-metal dielectric layer may include a plurality of alternately stacked capping layers and low-k dielectric layers.

In some embodiments, the capping layers may include SiCN, and the low-k dielectric layers may include SiCOH.

In some embodiments, providing carbon to at least one surface may include substituting Si—OH bonds in the low-k dielectric layers with Si—CH$_3$ bonds by providing surfaces of the low-k dielectric layers with a gas including carbon and optionally at least one of silicon (Si), hydrogen (H), oxygen (O) and nitrogen (N).

In some embodiments, providing carbon to at least one surface may include hydrophobically treating surfaces of the low-k dielectric layers by providing the surfaces of the low-k dielectric layers with a gas including carbon and optionally at least one of silicon (Si), hydrogen (H), oxygen (O) and nitrogen (N).

In some embodiments, providing carbon to at least one surface may include hydrophobically treating a surface of the substrate exposed through the via-hole.

In some embodiments, forming the via-hole may include forming a mask layer on the inter-metal dielectric layer; patterning the inter-metal dielectric layer and the substrate to form the via-hole by an etching process using the mask layer as an etch mask; and removing the mask layer by an ashing process using a gas including CO, $CO_2$, $N_2/H_2$, $O_2$, or any combination thereof at a temperature of about 200° C. or less.

In some embodiments, providing carbon to at least one surface may include hydrophobically treating an inner surface of the via-hole by providing the via-hole with a gas including carbon and optionally at least one of silicon (Si), hydrogen (H), oxygen (O) and nitrogen (N).

In some embodiments, forming the via-hole may include forming a vertical hole completely penetrating the inter-metal dielectric layer and partially penetrating the substrate by an etching process.

In some embodiments, the method may further include before and/or after providing carbon to at least one surface, providing the via-hole with diluted hydrofluoric acid (DHF) to hydrophobically treat a surface of the substrate exposed through the via-hole.

In another aspect, the semiconductor device may include a semiconductor substrate on which an integrated circuit is disposed; an inter-metal dielectric layer provided on the semiconductor substrate, the inter-metal dielectric layer including at least one metal interconnection electrically connected to the integrated circuit; and a through-electrode vertically penetrating the inter-metal dielectric layer and the semiconductor substrate. The inter-metal dielectric layer may include a carbon-containing low-k dielectric layer having a dielectric constant lower than that of silicon dioxide. The low-k dielectric layer may include a surface adjacent to the through-electrode; and a bulk distal to the through-electrode in a horizontal direction. A carbon concentration of the low-k dielectric layer may become reduced and then increased from the surface of the low-k dielectric layer toward the bulk of the low-k dielectric layer.

In some embodiments, the carbon concentration of the low-k dielectric layer may include a first concentration at the surface of the low-k dielectric layer; a second concentration in a surface-nearby region adjacent to the surface of the low-k dielectric layer, the second concentration lower than the first concentration; and a third concentration in the bulk, the third concentration higher than the second concentration.

In some embodiments, the first concentration may be equal to or higher than the third concentration.

In some embodiments, the inter-metal dielectric layer may further include an insulating capping layer covering the low-k dielectric layer.

In some embodiments, the low-k dielectric layer may include SiCOH, and the insulating capping layer may include SiCN.

In some embodiments, a method may be provided, the method including providing a semiconductor substrate including at least one dielectric layer and a via-hole vertically penetrating the at least one dielectric layer and the semiconductor substrate, the at least one dielectric layer having a first portion exposed by the via-hole with a first concentration of carbon and a second portion with a second concentration of carbon, wherein the first concentration is less than the second concentration; and adding carbon to at least the first portion of the at least one dielectric layer. In some embodiments, the method may be a method for fabricating a semiconductor device.

In some embodiments, the at least one dielectric layer may be a low-k dielectric layer, such as an ultra low-k dielectric layer. In some embodiments, the first portion may be a surface region of the at least one dielectric layer that may be adjacent to a through-electrode, and the second portion may include an end region of the at least one dielectric layer that is opposite the first portion.

In some embodiments, adding carbon to at least the first portion of the at least one dielectric layer includes converting a hydrophilic property in the first portion to a hydrophobic property. Some embodiments provide that the hydrophilic property includes a SiOH bond and that the hydrophobic property includes a Si—$CH_3$ bond.

In some embodiments, adding carbon to at least the first portion of the at least one dielectric layer includes contacting a gas to at least the first portion of the at least one dielectric layer, the gas including carbon and optionally silicon, hydrogen, oxygen, and/or nitrogen.

In some embodiments, adding carbon to at least the first portion of the at least one dielectric layer is carried out at a temperature in a range of about 200° C. to about 500° C. in an oxidation or inert atmosphere.

BRIEF DESCRIPTION OF THE DRAWINGS

The present inventive concepts will become more apparent in view of the attached drawings and accompanying detailed description.

DETAILED DESCRIPTION OF EMBODIMENTS

Figure 1A:
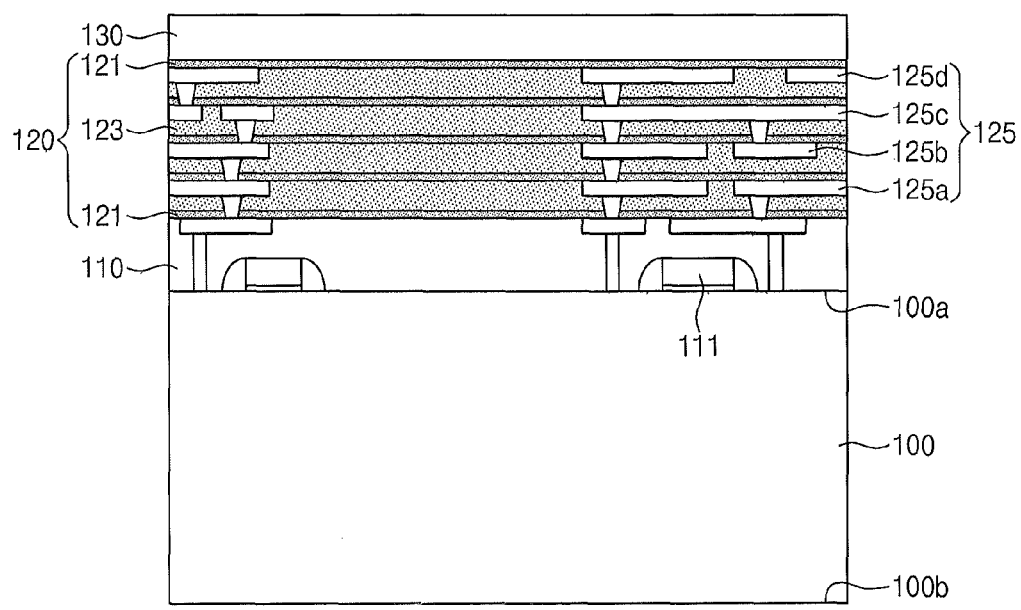
FIGS. 1A to 1H are cross-sectional views illustrating a method for fabricating a semiconductor device according to various embodiments of the present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "on," another element, it can be directly coupled, connected, or on, the other element, or intervening elements may also be present. In contrast, when an element is referred to as being "directly coupled," "directly connected," or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the present inventive concepts should not be construed as limited to the particular shapes of regions illustrated herein but are to include deviations in shapes that result, for example, from manufacturing.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this present inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIGS. 1A to 1H are cross-sectional views illustrating a method for fabricating a semiconductor device according to some embodiments of the present inventive concepts. FIG. 2A is a cross-sectional view illustrating a portion of FIG. 1B according to some embodiments of the present inventive concepts. FIG. 2B is a schematic diagram illustrating bonding states of a surface region of a general low-k dielectric layer according to some embodiments of the present inventive concepts. FIG. 2C is a schematic diagram illustrating bonding states of a surface region of a low-k dielectric layer in which a carbon loss has occurred according to some embodiments of the present inventive concepts. FIG. 2D is a schematic diagram illustrating bonding states of a surface region of a low-k dielectric layer that has been supplemented with carbon by a recovery process according to some embodiments of the present inventive concepts.

Figure 2A:
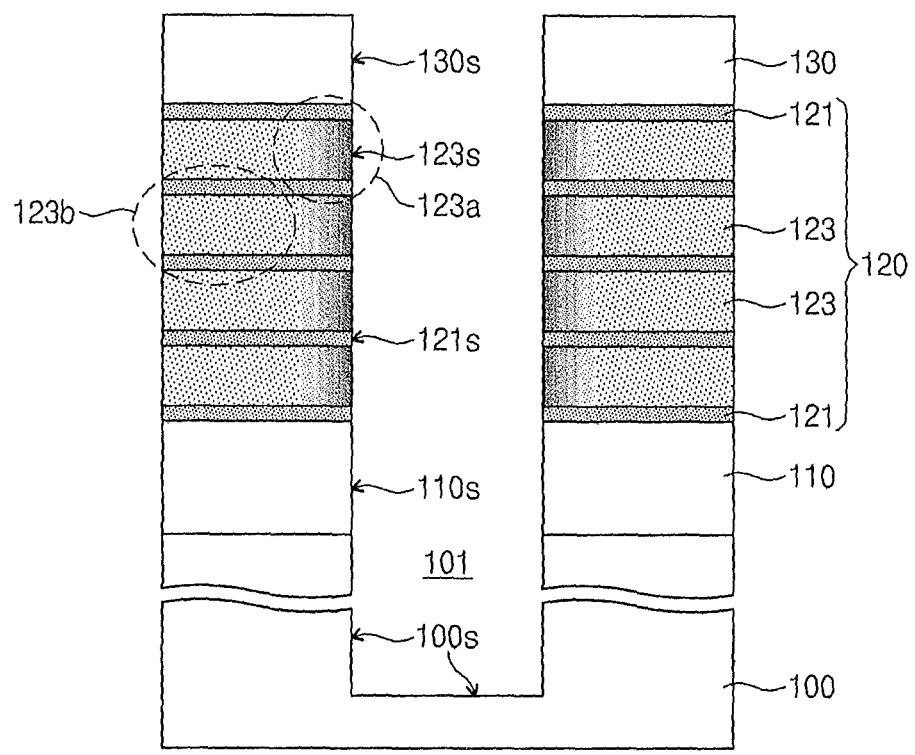
FIG. 2A is a cross-sectional view illustrating a portion of FIG. 1B according to various embodiments of the present inventive concepts.
Figure 2B:
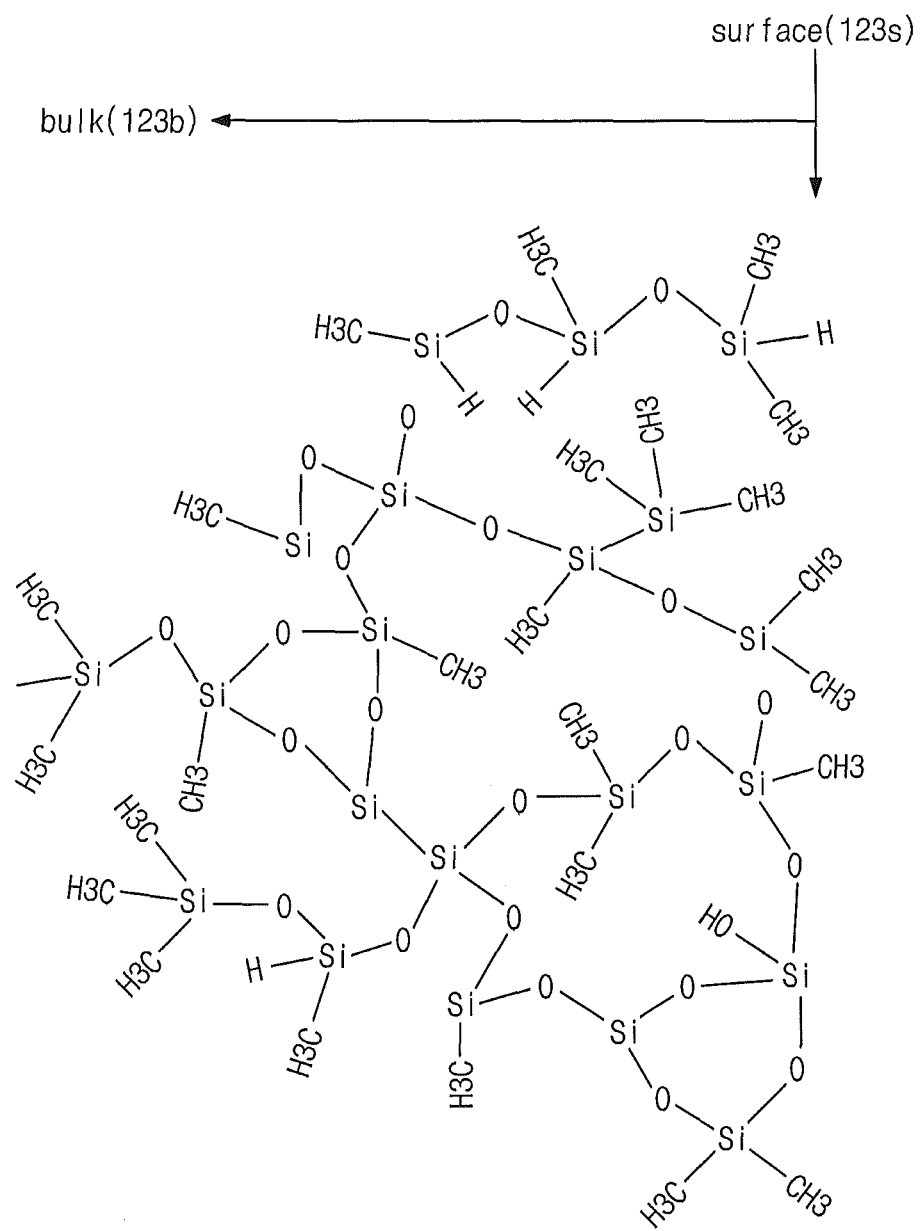
FIG. 2B is a schematic diagram illustrating bonding states of a surface region of a general low-k dielectric layer according to various embodiments of the present inventive concepts.
Figure 2C:
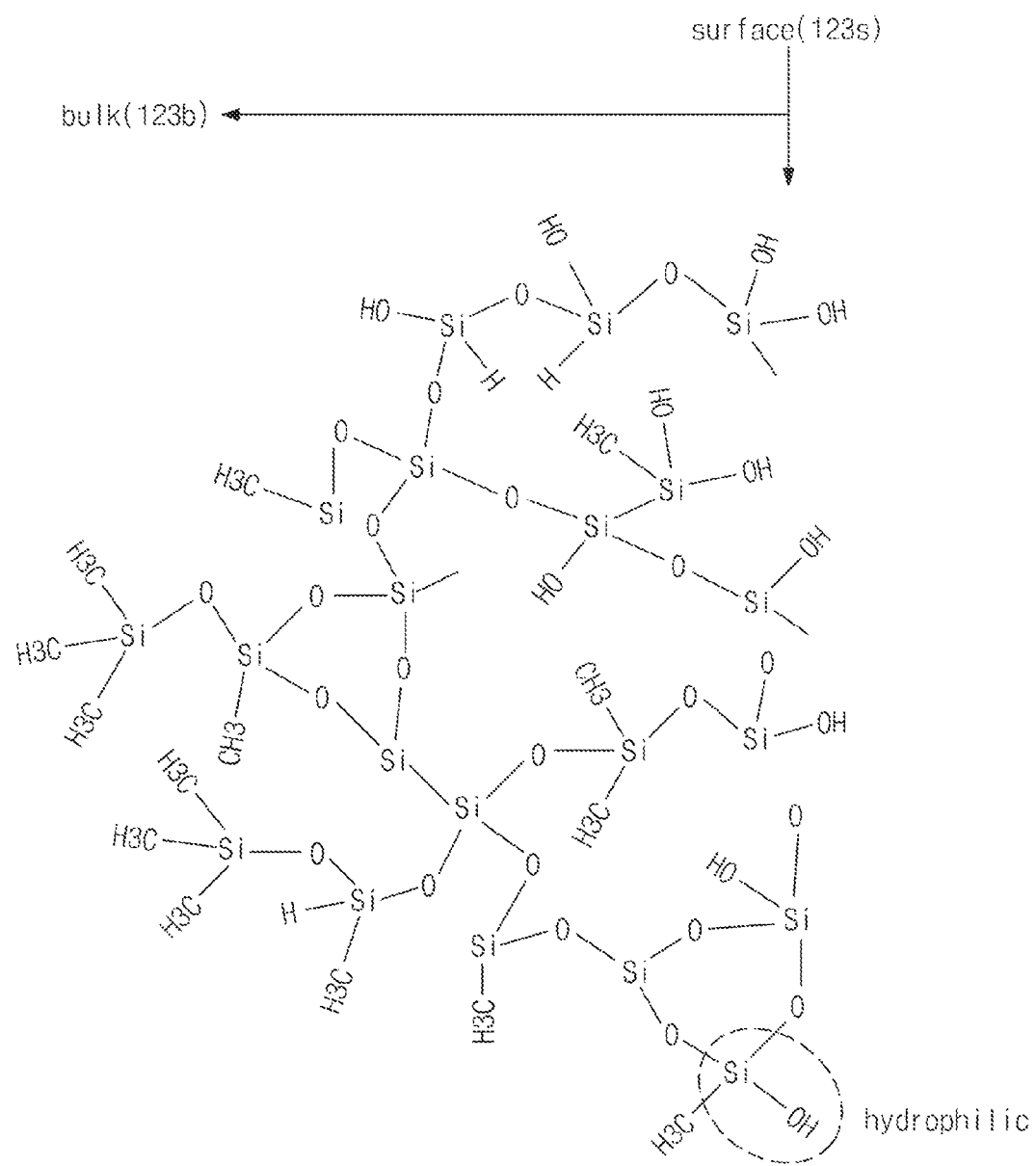
FIG. 2C is a schematic diagram illustrating bonding states of a surface region of a low-k dielectric layer in which carbon loss has occurred according to various embodiments of the present inventive concepts.
Figure 2D:
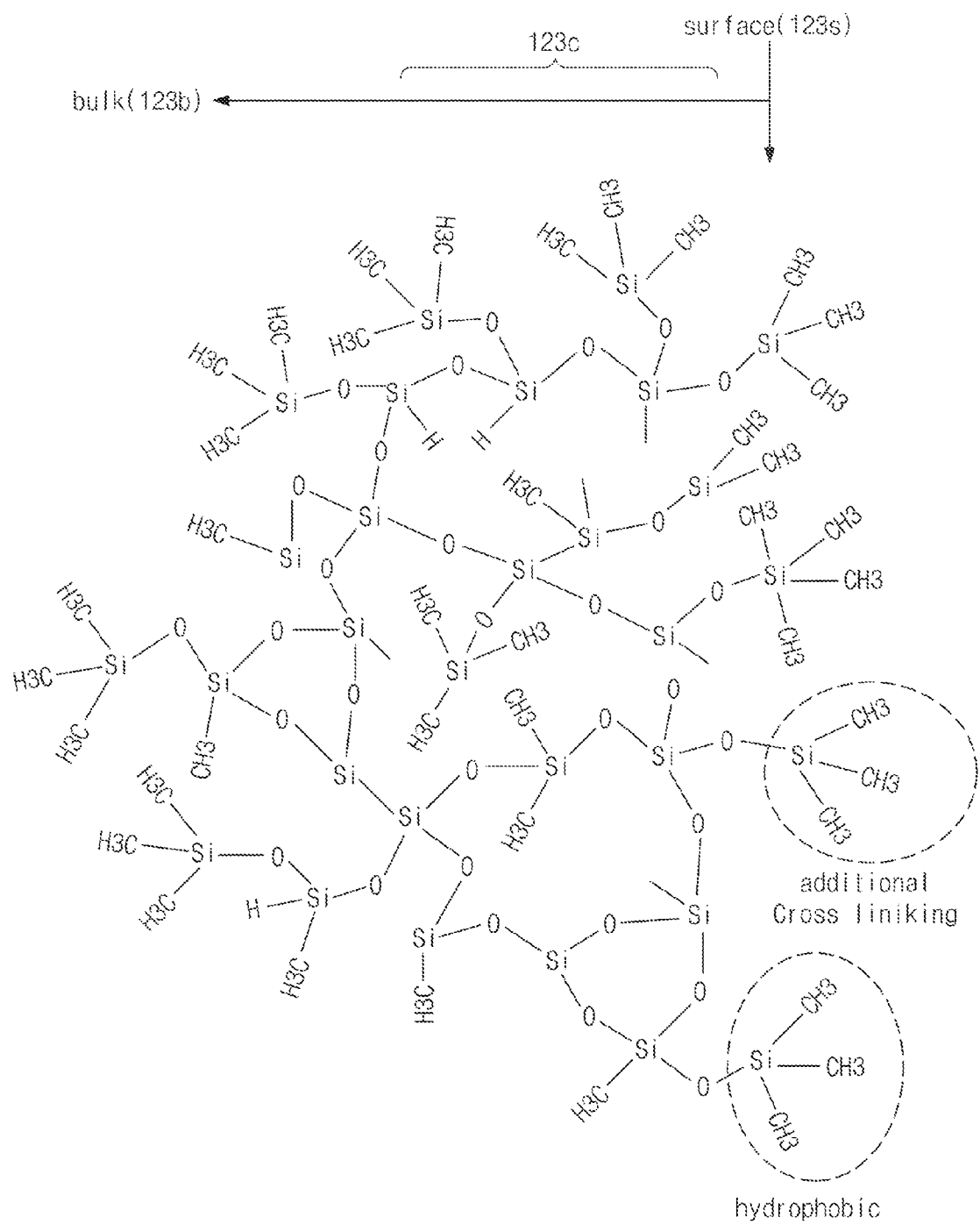
FIG. 2D is a schematic diagram illustrating bonding states of a surface region of a low-k dielectric layer that has been supplemented with carbon by a recovery process according to various embodiments of the present inventive concepts.

Referring to FIG. 1A, a semiconductor substrate 100 may be provided which has a top surface 100a and a bottom surface 100b. An interlayer dielectric (ILD) layer 110 including an integrated circuit 111, and an inter-metal dielectric (IMD) layer 120 including a metal interconnection 125 may be sequentially formed on the top surface 100a of the substrate 100. An upper dielectric layer 130 may be further formed on the inter-metal dielectric layer 120. The upper dielectric layer 130 may cover the inter-metal dielectric layer 120. The semiconductor substrate 100 may be a wafer including a semiconductor such as silicon. The integrated circuit 111 may include a memory circuit, a logic circuit, or a combination thereof. At least one of the interlayer dielectric layer 110 and the upper dielectric layer 130 may include a silicon oxide layer or a silicon nitride layer. For example, at least one of the interlayer dielectric layer 110 and the upper dielectric layer 130 may include a tetraethylorthosilicate (TEOS) oxide layer formed by a chemical vapor deposition (CVD) process.

The inter-metal dielectric layer 120 may include a low-k dielectric having a dielectric constant lower than that of silicon dioxide ($SiO_2$). In some embodiments, the low-k dielectric may be an ultra low-k dielectric. For example, the inter-metal dielectric layer 120 may include a silicon-based polymeric dielectric (e.g., fluorine-doped silicon dioxide, carbon-doped silicon dioxide, porous silicon dioxide, hydrogen silsesquioxane (HSG), or methylsilsesquioxane (MSG)), an organic polymeric dielectric (e.g., polyimide), SiCOH, SiLK™ from Dow Chemical Company, or AURORA™ from ASM International Company. The inter-metal dielectric layer 120 is not limited to the materials described above. In some embodiments, the inter-metal dielectric layer 120 may include any dielectric having a dielectric constant in a range of about 1.8 to about 3.5.

The metal interconnection 125 may have a multi-layered structure and the inter-metal dielectric layer 120 may have a multi-layered structure. In some embodiments, the metal interconnection 125 may have a multi-layered structure having first to fourth metal interconnections 125a, 125b, 125c and 125d which are vertically stacked and electrically connected to the integrated circuit 111. The inter-metal dielectric layer 120 may include a plurality of dielectric layers 123 provided between the first to fourth metal interconnections 125a, 125b, 125c and 125d. The dielectric layers 123 may include a low-k dielectric, such as, for example, an ultra low-k dielectric. For example, the dielectric layers 123 may include SiCOH. In some embodiments, some or all of the dielectric layers of the plurality of dielectric layers 123 may have different constituents from each other.

The four metal interconnections 125a to 125d are described as an example in the present specification. Accordingly, the number of the metal interconnections 125a to 125d is not limited to four. In some embodiments, the number of stacked metal interconnections may be greater than or smaller than four. Hereinafter, the dielectric layer 123 is defined as a low-k dielectric layer for convenience of explanation. The low-k dielectric layer 123 may include a low-k dielectric and/or an ultra low-k dielectric.

The inter-metal dielectric layer 120 may further include insulating capping layers 121 which reduce or prevent a metal element of the metal interconnection 125 from being diffused. The capping layers 121 may include a low-k dielectric, for example, SiCN. The capping layers 121 may be provided between the low-k dielectric layers 123, between a lowermost low-k dielectric layer 123 and the interlayer dielectric layer 110, and/or between an uppermost low-k dielectric layer 123 and the upper dielectric layer 130.

Figure 1B:
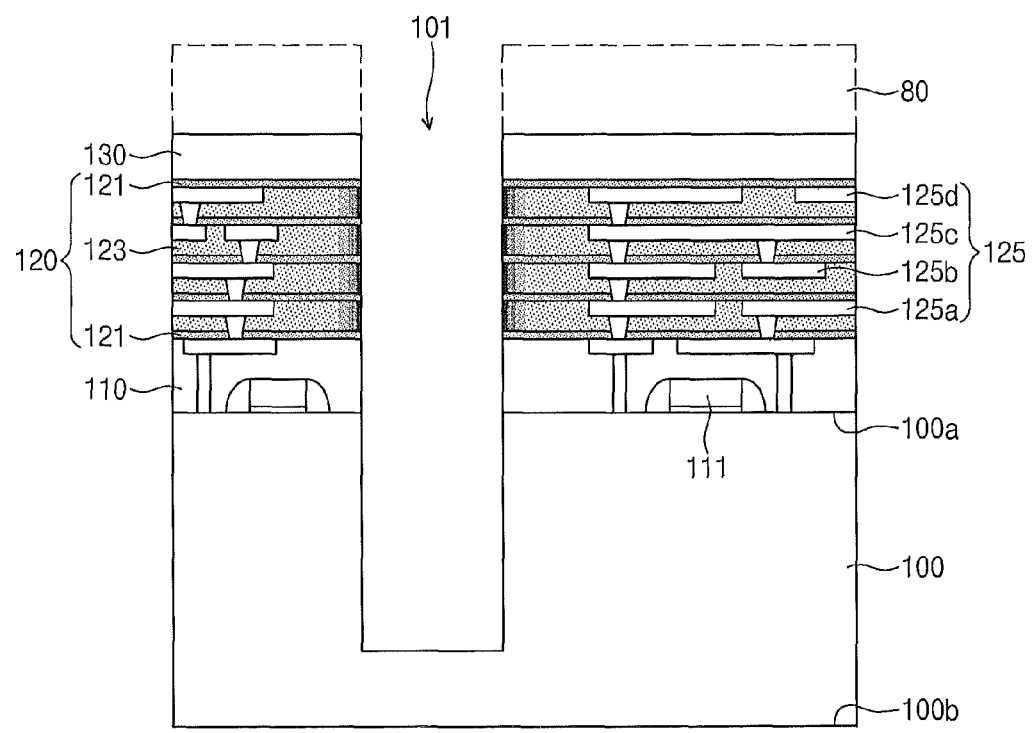

Referring to FIG. 1B, a mask layer 80 may be formed on the upper dielectric layer 130, and a via-hole 101 may then be formed by an etching process using the mask layer 80 as an etch mask. For example, a photoresist may be coated on the upper dielectric layer 130, and the coated photoresist may then be patterned to form the mask layer 80. The upper dielectric layer 130, the inter-metal dielectric layer 120, the interlayer dielectric layer 110, and the semiconductor substrate 110 may be patterned to form the via-hole 101 by a dry etching process using the mask layer 80 as an etch mask. A bottom surface of the via-hole 101 may not reach the bottom surface 100b of the semiconductor substrate 100. Sidewalls of the upper dielectric layer 130, the inter-metal dielectric layer 120, and the interlayer dielectric layer 110 may be exposed through the via-hole 101.

The mask layer 80 may be removed by an ashing process. An ashing gas may include CO, $CO_2$, $N_2/H_2$, $O_2$, or any combination thereof. The ashing process may be performed at a high temperature (e.g., 200° C. or more) or a low temperature (e.g., less than 200° C.). In some embodiments, the mask layer 80 may be removed by a high temperature $O_2$ ashing process of about 280° C. In some embodiments, the mask layer 80 may be removed by a low temperature $CO_2$ ashing process of about 100° C. or less, which can minimize ashing damage of the low-k dielectric layers 123. An organic strip process capable of removing a residue (e.g., the photoresist) may be further performed after the ashing process.

The inter-metal dielectric layer 120 may be damaged by at least one of the etching process and the ashing process. In some embodiments, the damage may be due to the loss of carbon, such as, but not limited to, the loss of carbon-containing groups (e.g., alkyl groups such as methyl groups, ethyl groups, etc.) in the inter-metal dielectric layer 120. In some embodiments, the carbon loss may be in a low-k dielectric layer 123 in the inter-metal dielectric layer 120. For example, referring now to FIGS. 2A-2D, a surface region 123a including a surface 123s exposed by the via-hole 101 of the low-k dielectric layer 123 may be damaged by at least one of the etching process and the ashing process, as illustrated in FIG. 2A.

In some embodiments, if the low-k dielectric layer 123 includes SiCOH as illustrated in FIG. 2B, a carbon loss may occur by the etching process and/or ashing process such that the surface region 123a of the low-k dielectric layer 123 may lose —$CH_3$ groups as illustrated in FIG. 2C. Since the low-k dielectric layer 123 loses —$CH_3$ groups, the low-k characteristic of the low-k dielectric layer 123 may be deteriorated.

A surface 100s of the semiconductor substrate 100, which is exposed by the via-hole 101, may have a hydrophilic property, such as, for example, it may include a Si—OH group, by at least one of the etching process and the ashing process. Thus, a strip process using diluted hydrofluoric acid (DHF) may be performed to hydrophobically treat the surface 100s of the semiconductor substrate 100. However, if the carbon loss occurs in the low-k dielectric layers 123, the surfaces 123s of the low-k dielectric layers 123 may have no resistance to the DHF such that the surface regions 123a of the lower-k dielectric layers 123 may be etched during the DHF strip process. In some embodiments, a recovery process supplementing the carbon loss may be performed in order to maintain a low-k characteristic of the low-dielectric layer 123 and/or in order to secure resistance to a DHF strip process of the low-k dielectric layer 123, as later mentioned with reference to FIG. 1C.

Figure 1C:
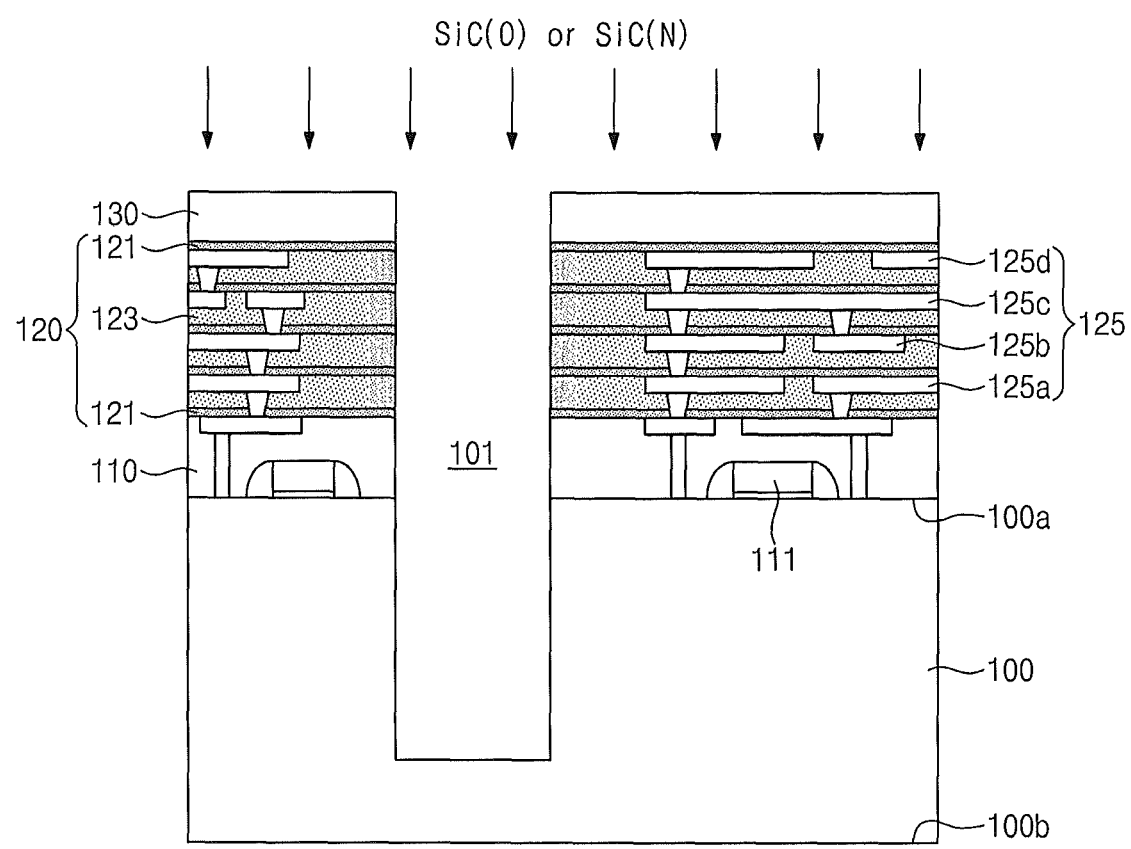
Figure 1D:
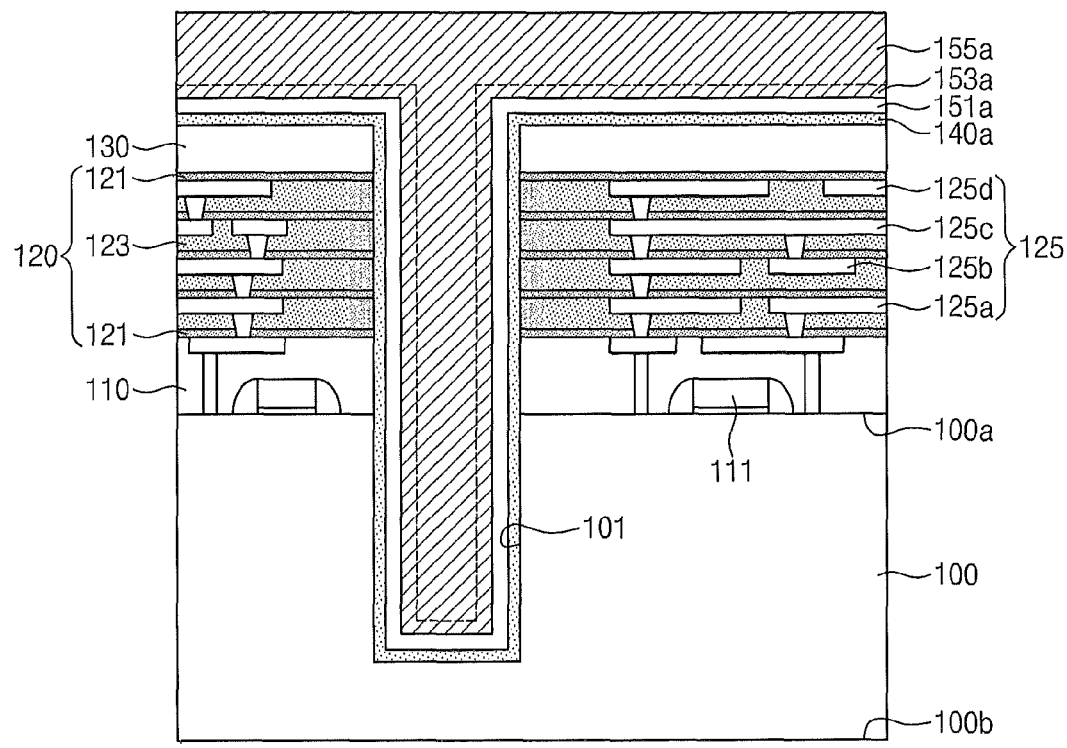

Referring to FIG. 1C, the recovery process may be capable of supplementing the low-k dielectric layer 123 with carbon. The recovery process may be performed by providing a gas including carbon or carbon inclusive of at least one of silicon (Si), hydrogen (H), oxygen (O) and nitrogen (N) to the low-k dielectric layer 123. In some embodiments, the gas may include carbon and at least one of silicon (Si), hydrogen (H), oxygen (O) and nitrogen (N). For example, the provided gas may include SiC, SiCO, SiCN, or any combination thereof. In some embodiments, the gas may be provided such that the gas contacts at least a portion of a low-k dielectric layer 123 such as, for example, a surface 123s and/or surface region 123a of the low-k dielectric layer 123. The recovery process may be performed at a temperature in a range of about 200° C. to about 500° C. under an oxidation or inert atmosphere. The recovery process may be performed using a thermal process or an ultraviolet (UV) curing process. In some embodiments, the recovery process may substitute the —OH group of the Si—OH bond shown in FIG. 2C with a —CH$_3$ group to form a Si—CH$_3$ bond such that the carbon loss of the low-k dielectric layer 123 may be supplemented. The surface region 123a in which the carbon loss occurs may be recovered to have Si—CH$_3$ bonds by the supplement of the carbon, so that the low-k dielectric layer 123 may maintain its low-k characteristic and/or may have resistance to a DHF strip process.

The low-k dielectric layer 123 may have a non-uniform carbon concentration as a result of the carbon loss and the recovery process. After performing a recovery process, the carbon concentration of the low-k dielectric layer 123 may become reduced and then increased from the surface 123s toward a bulk region 123b of the low-k dielectric layer 123. Referring to FIG. 2D, in some embodiments, the surface 123s may have a first carbon concentration, and a surface-nearby region 123c adjacent to the surface 123s may have a second carbon concentration lower than the first carbon concentration. The bulk region 123b may have a third carbon concentration higher than the second carbon concentration. In some embodiments, the first carbon concentration of the surface 123s may be equal or similar to the third carbon concentration of the bulk region 123b. In some embodiments, the first carbon concentration of the surface 123s may be different from the third carbon concentration of the bulk region 123b. For example, if the number of Si—CH$_3$ bonds is greater at the surface 123s, the first carbon concentration may be higher than the third carbon concentration.

The surface 123s of the low-k dielectric layer 123 may be converted from having a hydrophilic property to having a hydrophobic property by the recovery process. For example, due to the carbon loss caused by the etching process and/or ashing process, the surface 123s of the low-k dielectric layer 123 may include a Si—OH bond, thereby providing a hydrophilic property at the surface 123s, as illustrated in FIG. 2C. In some embodiments, by using the recovery process, the surface 123s of the low-k dielectric layer 123 may be converted from a hydrophilic surface to a hydrophobic surface. As described later with reference to FIG. 1D, the hydrophilic property due to the Si—OH bond may reduce a deposition rate of a dielectric layer 140a, which may cause imperfect and/or defective deposition and/or non-uniformity of a thickness of the dielectric layer 140a. Since the surface 123s of the low-k dielectric layer 123 may be substituted with a Si—CH$_3$ bond having a hydrophobic property by the recovery process, good deposition of the dielectric layer 140a may be induced.

The surface 100s of the semiconductor substrate 100 exposed through the via-hole 101 may be hydrophobically treated by the recovery process. Thus, there may be no need to perform the DHF strip process for hydrophobically treating the surface 100s. As illustrated in FIG. 2A, the recovery process may hydrophobically treat a surface 110s of the interlayer dielectric layer 110, a surface 121s of the capping layer 121, and a surface 130s of the upper dielectric layer 130, which are exposed by the via-hole 101.

If the recovery process is not performed, it may be required to perform a DHF strip process for hydrophobically treating the surface 100s of the semiconductor substrate 100. The DHF strip process may cause removal of the surface region 123a of the low-k dielectric layer 123 and/or imperfections and/or defects in the deposition process of the dielectric layer 140a due to the hydrophilic property of the surfaces 123s. In some embodiments, the recovery process may be performed to cure etching damage in the low-k dielectric layer 123, to maintain the low-k characteristic of the low-k dielectric layer 123, and/or to hydrophobically treat the surface 123s. In addition, the surface 100s of the semiconductor substrate 110 can be hydrophobically treated by the recovery process without the DHF strip process. In some embodiments, the DHF strip process may be further performed before and/or after the recovery process.

An inner surface of the via-hole 101 consisting of the surfaces 100s, 110s, 121s, 123s, and 130s exposed by the vi-hole 101 may have a heterogeneous surface state because at least some surfaces, such as for example surfaces 123s and 100s, may have a hydrophilic property by the influence of the etching process and/or ashing process. However, after the recovery process, the inner surface of the via-hole 101 may have a homogeneous surface state having a hydrophobic property.

Referring to FIG. 10, the dielectric layer 140a may be formed to cover the inner sidewall of the via-hole 101 and a top surface of the upper dielectric layer 130. The dielectric layer 140a may include a silicon oxide layer deposited by a CVD process. The dielectric layer 140a may be formed by depositing a high-aspect-ratio process (HARP) oxide using a sub-atmospheric chemical vapor deposition (SACVD) process. Next, a conductive layer 155a may be formed on the semiconductor substrate 100 to fill the via-hole 101. In some embodiments, since the inner surface of the via-hole 101 is hydrophobically treated, the dielectric layer 140a may be deposited very well on the inner surface of the via-hole 101.

The conductive layer 155a may be formed of poly-silicon, copper, tungsten, and/or aluminum by a deposition technique and/or a plating technique. If the conductive layer 155a is formed of copper or a conductive material including copper, a metal layer 151a capable of preventing diffusion of copper may be further formed on the dielectric layer 140a. The metal layer 151a may be formed by depositing a metal including titanium (Ti), titanium nitride (TiN), chrome (Cr), tantalum (Ta), tantalum nitride (TaN), nickel (Ni), tungsten (W), tungsten nitride (WN), or any combination thereof. The metal layer 151a may be formed to extend along the dielectric layer 140a.

In some embodiments, the conductive layer 155a may be formed by electroplating copper. For example, a seed layer 153a may be formed on the dielectric layer 140a or the metal layer 151a, and the conductive layer 155a may then be formed by an electroplating process using the seed layer 153a. The seed layer 153a may be formed of a metal, for example, copper or a metal including copper (e.g., copper-manganese (CuMn)) by a physical vapor deposition (PVD) process or a chemical vapor deposition (CVD) process.

After the formation of the conductive layer 155a, the upper dielectric layer 130 or the dielectric layer 140a on the upper dielectric layer 130 may be exposed by a planarization process. For example, a chemical mechanical polishing (CMP) process may be performed until the upper dielectric layer 130 is exposed.

Figure 1E:
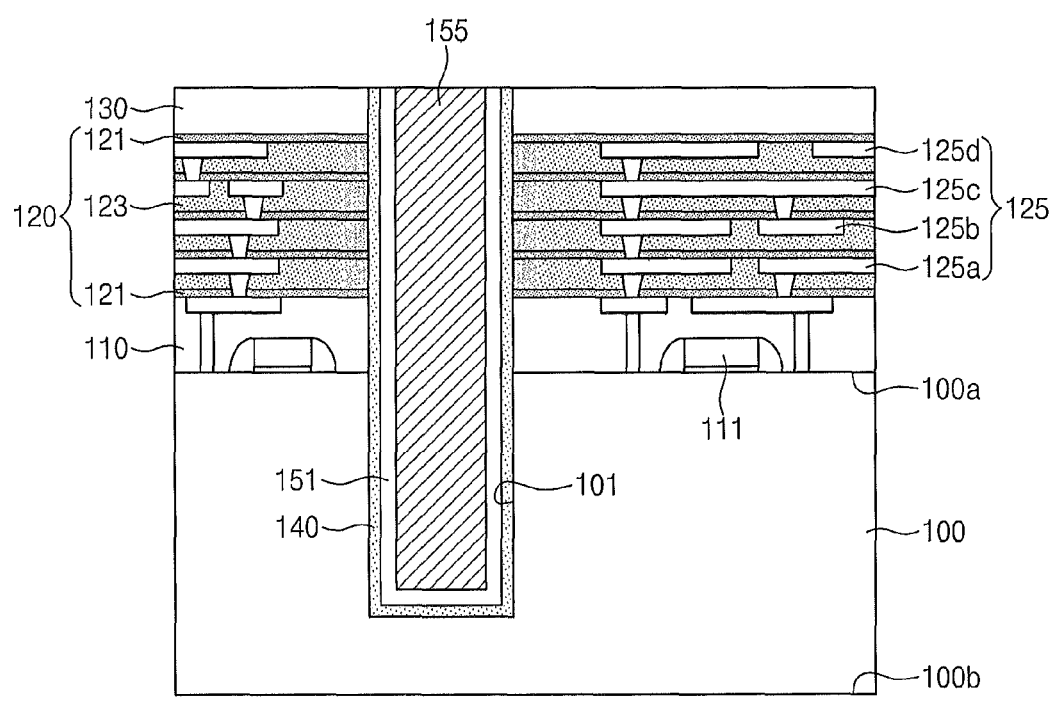

Referring to FIG. 1E, the dielectric layer 140a may be transformed into a via-dielectric layer 140 and the conductive layer 155a may be transformed into a through-electrode 155 by the planarization process. The seed layer 153a may correspond to a portion of the through-electrode 155. The through-electrode 155 may completely penetrate the upper dielectric layer 130, the inter-metal dielectric layer 120, and the interlayer dielectric layer 110 and may partially penetrate the semiconductor substrate 100.

The via-dielectric layer 140 may have a cup-shape surrounding a sidewall and a bottom surface of the through-electrode 155. In some embodiments, if the dielectric layer 140a is used as a polishing stop layer during the CMP process, the via-dielectric layer 140 may surround the sidewall and the bottom surface of the through-electrode 155 and may further extend onto the top surface of the upper dielectric layer 130.

In the event that the metal layer 151a is further formed, the metal layer 151a may be transformed into a barrier layer 151 preventing an element (e.g., copper) of the through-electrode 155 from being diffused into the semiconductor substrate 100 or the integrated circuit 111 by the planarization process.

Figure 1F:
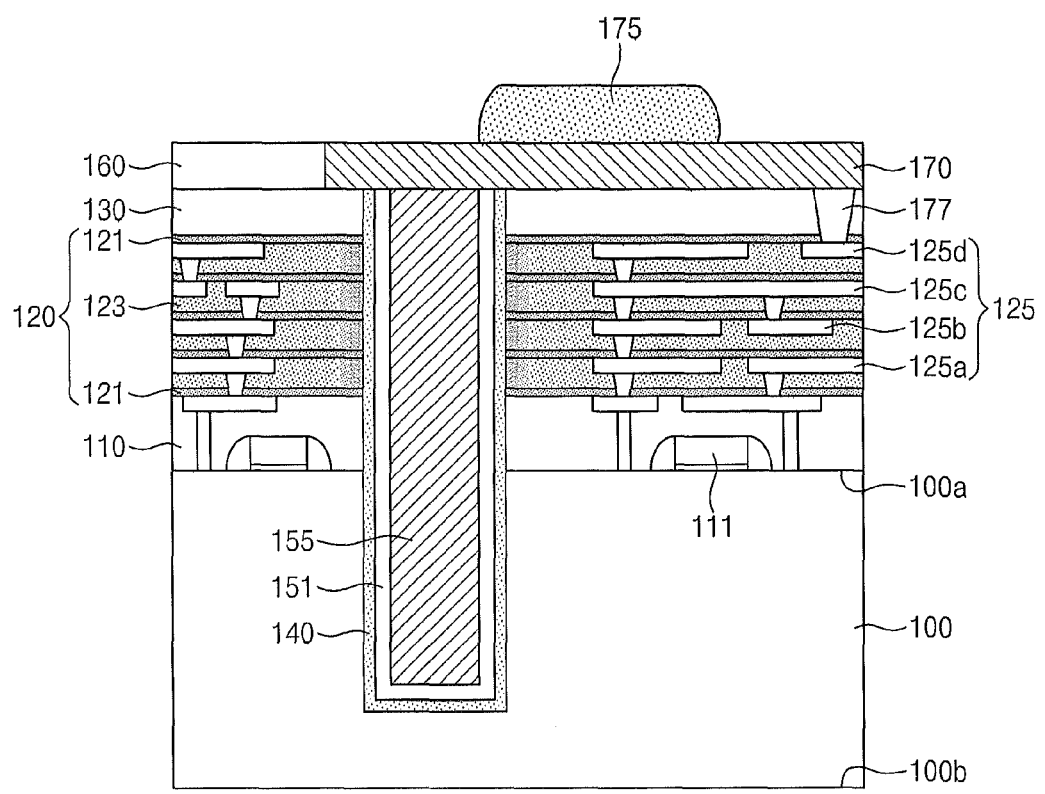

Referring to FIG. 1F, an upper interconnection 170 electrically connected to the through-electrode 155 may be formed on the semiconductor substrate 100. In some embodiments, the upper interconnection 170 contacting the through-electrode 155 may be formed on the upper dielectric layer 130 using a deposition process or a damascene process. In some embodiments, the upper interconnection 170 may be formed together with the through-electrode 155 by an electroplating process. The upper interconnection 170 may be electrically connected to the metal interconnection 125 (e.g., the fourth metal interconnection 125d) through a via 177 penetrating the upper dielectric layer 130, so as to electrically connect the through-electrode 155 to the integrated circuit 111. A second upper dielectric layer 160 may be further formed on the semiconductor substrate 100. The second upper dielectric layer 160 may act as an electrically insulating layer between adjacent upper interconnection 170 and/or a protecting layer. In some embodiments, an upper terminal 175 may be formed on the upper interconnection 170. The upper terminal 175 may be formed of a lead (Pb)-free solder.

Figure 1G:
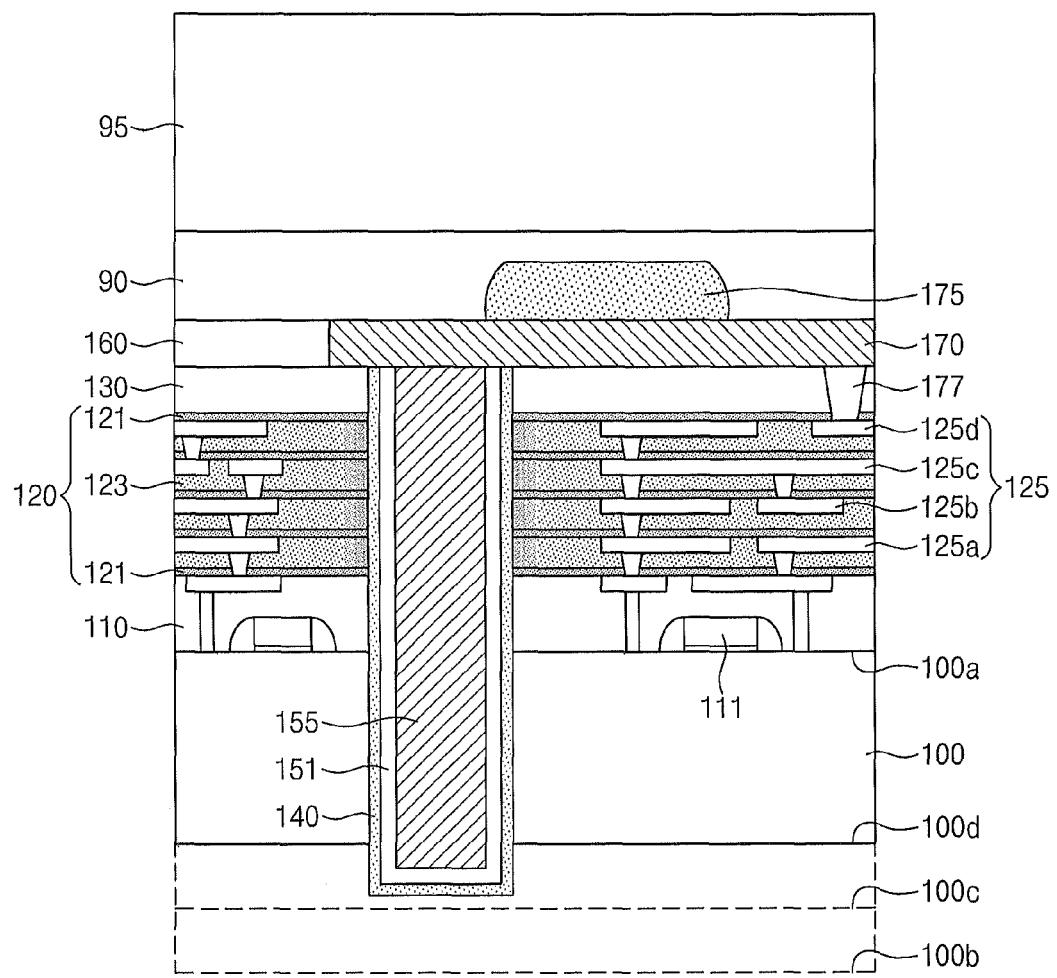

Referring to FIG. 1G, the semiconductor substrate 100 may be recessed until the through-electrode 155 protrudes. For example, the bottom surface 100b of the semiconductor substrate 100 may be recessed by at least one of a grinding process, a chemical mechanical polishing process and an etching process which use an etchant or slurry capable of selectively removing the material (e.g., silicon) of the semiconductor substrate 100. The recess process may be performed until a third bottom surface 100d is exposed. The third bottom surface 100d may be more adjacent to the top surface 100a than the bottom surface 100b, and the through-electrode 155 may protrude from the third bottom surface 100d. For example, the bottom surface 100b of the semiconductor substrate 100 may be chemically-mechanically polished to emerge a second bottom surface 100c through which the through-electrode 155 is not exposed, and the second bottom surface 100c may then be dry-etched to reveal the third bottom surface 100d through which the through-electrode 155 is exposed. In some embodiments, the bottom surface 100b of the semiconductor substrate 100 may be ground to expose the second bottom surface 100c, and the second bottom surface 100c may then be chemically and mechanically polished to expose the third bottom surface 100d.

A carrier 95 may be adhered to the top surface 100a of the semiconductor substrate 100 by an adhesive layer 90, and the protruding process of the through-electrode 155 may be then performed. The semiconductor substrate 100 may be overturned such that the bottom surface 100b may face upward, and the protruding process may then be performed under a condition that the bottom surface 100b faces upward. The top surface 100a may be hereinafter referred to as an active surface, and the third bottom surface 100d may be hereinafter referred to as an inactive surface.

Figure 1H:
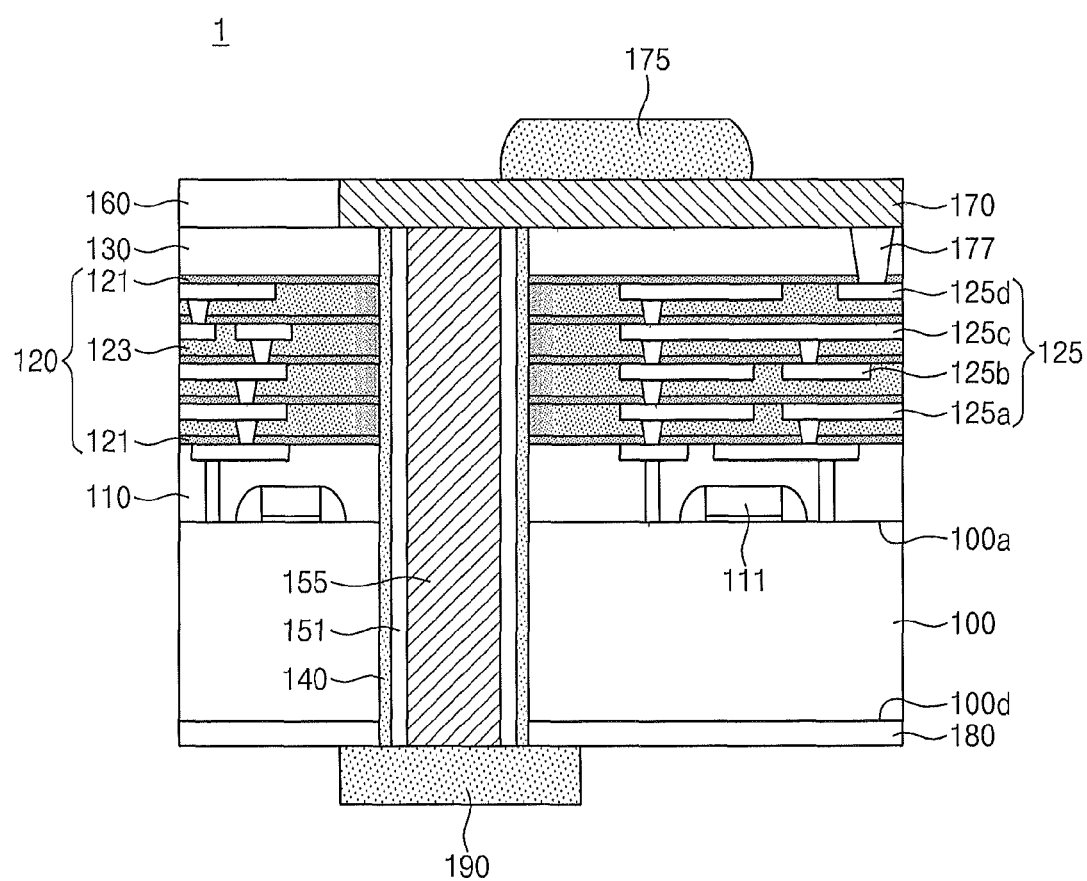

Referring to FIG. 1H, a lower dielectric layer 180 may be formed on the inactive surface 100d of the semiconductor substrate 100. In some embodiments, a silicon oxide layer or a silicon nitride layer may be deposited on the inactive surface 100d so as to cover the through-electrode 155, and a chemical mechanical polishing process may then be performed on the deposited silicon oxide layer or silicon nitride layer to form a planarized lower dielectric layer 180. The through-electrode 155 may be exposed through the lower dielectric layer 180. Next, a lower terminal 190 electrically connected to the through-electrode 155 may be formed on the lower dielectric layer 180. The lower terminal 190 may have a pad-shape or a solder ball-shape. A semiconductor device 1 including the through-electrode 155 may be fabricated according to the embodiments described above.

In some embodiments, the low-k dielectric layers 123 constituting the inter-metal dielectric layer 120 may reduce parasitic capacitance between the first to fourth metal interconnections 125a to 125d, thereby reducing or removing data errors caused by noise, delay and/or loss of electrical signals transmitted through the first to fourth metal interconnections 125a to 125d.

FIGS. 3A to 3G are cross-sectional views illustrating a method for fabricating a semiconductor device according to some embodiments of the present inventive concepts.

Figure 3A:
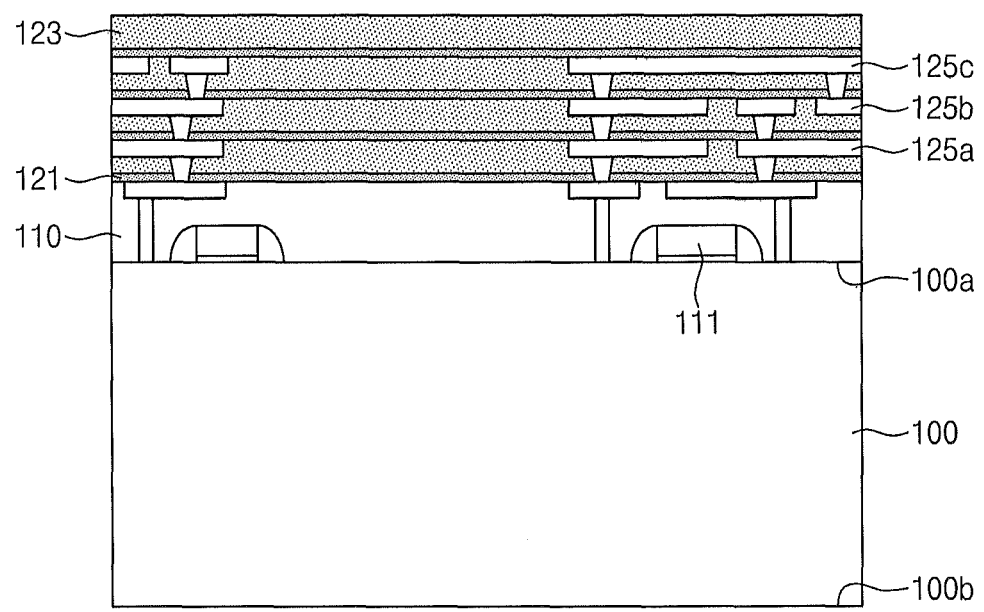
FIGS. 3A to 3G are cross-sectional views illustrating a method for fabricating a semiconductor device according to various embodiments of the present inventive concepts.

Referring to FIG. 3A, an interlayer dielectric layer 110 including an integrated circuit 111 may be formed on an active surface 100a of a semiconductor substrate 100 having a bottom surface 100b, and a capping layer 121 and a low-k dielectric layer 123 may be repeatedly and alternately stacked on the interlayer dielectric layer 110. First to third metal interconnections 125a, 125b and 125c may be included in the low-k dielectric layers 123. An uppermost layer of the stacked layers on the semiconductor substrate 100 may be the low-k dielectric layer 123 or the capping layer 121. In some embodiments, the uppermost layer being the low-k dielectric layer 123 will be described as an example. However, features of the present embodiments may be applied when the uppermost layer is the capping layer 121.

Figure 3B:
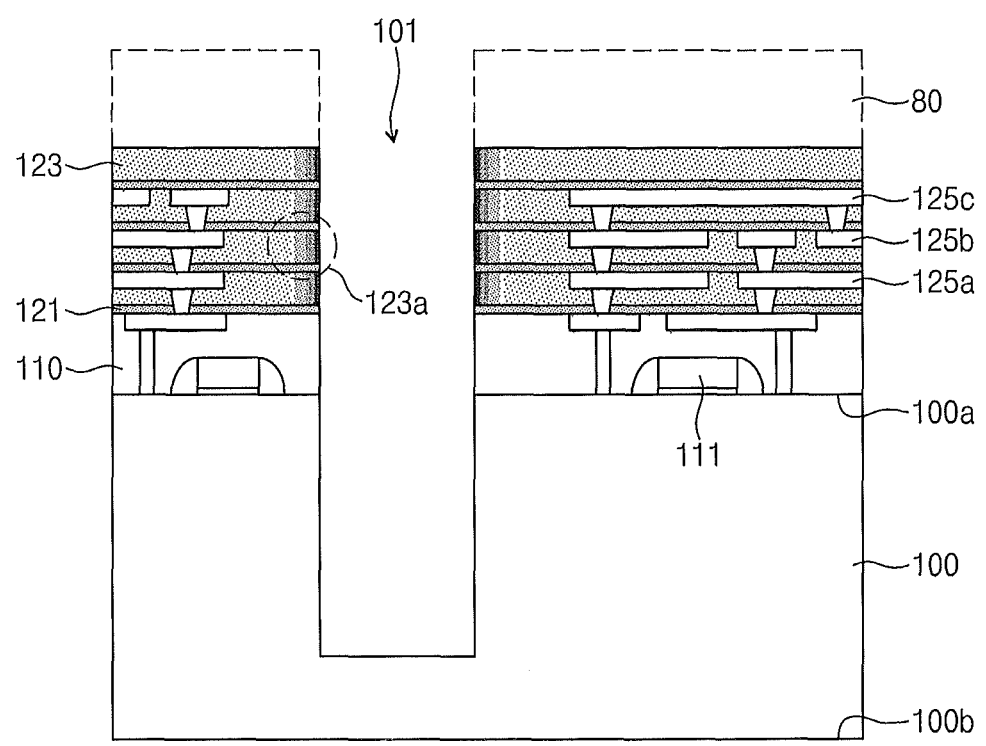

Referring to FIG. 3B, a mask layer 80 may be formed on the low-k dielectric layer 123 of the uppermost layer, and a dry etching process using the mask layer 80 may be performed to form a via-hole 101. The via-hole 101 may not reach the bottom surface 100b of the semiconductor substrate 100. The mask layer 80 may be removed by, for example, a low temperature $CO_2$ ashing process of about 100° C. or less. Etching damage and/or a carbon loss may occur in a surface region 123a of the low-k dielectric layer 123 by the etching process and/or the ashing process.

Figure 3C:
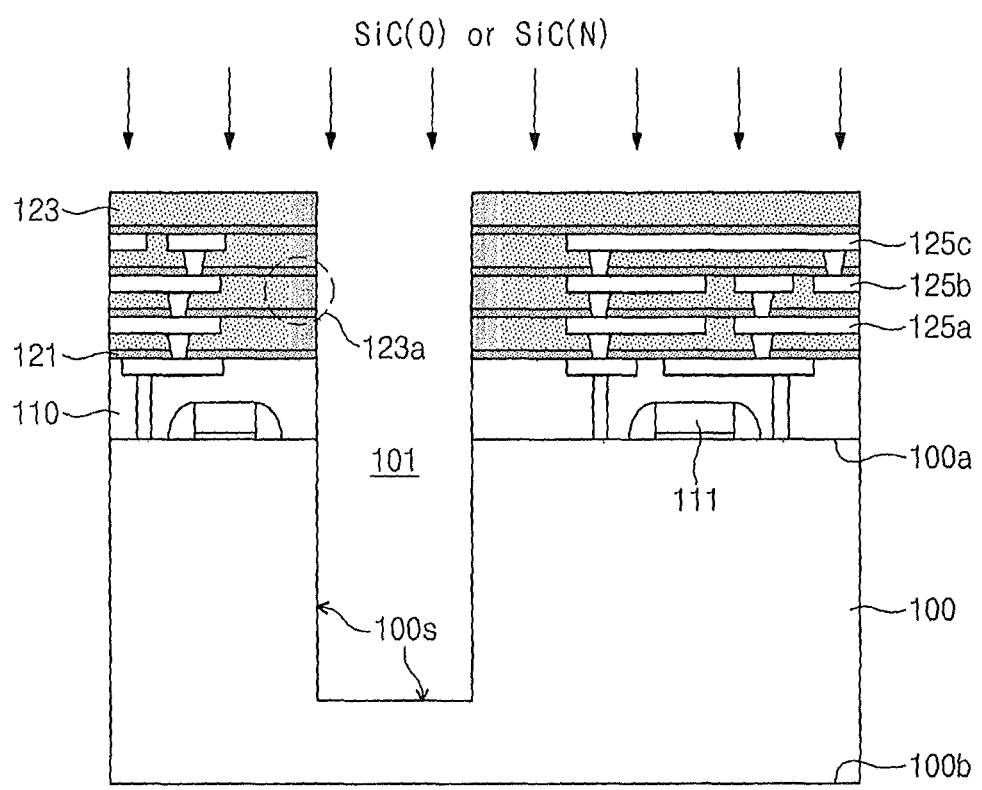

Referring to FIG. 3C, in order to cure the damage and/or carbon loss, a recovery process of supplementing the low-k dielectric layer 123 with carbon may be performed by providing a gas including carbon or carbon inclusive of at least one of silicon (Si), hydrogen (H), oxygen (O) and nitrogen (N) (e.g., SiC, SiCO, SiCN, or any combination thereof). The surface region 123a of the low-k dielectric layer 123 may be supplemented with carbon by the recovery process such that a Si—OH bond having a hydrophilic property in the surface region 123a may be substituted with a Si—CH$_3$ bond having a hydrophobic property. A surface 100s of the semiconductor substrate 100, which is exposed through the via-hole 101, may be changed to have a hydrophobic property by the recovery process such that it may be possible to skip a DHF strip process for hydrophobically treating the surface 100s of the semiconductor substrate 100. Alternatively, the DHF strip process may be further performed before and/or after the recovery process.

Figure 3D:
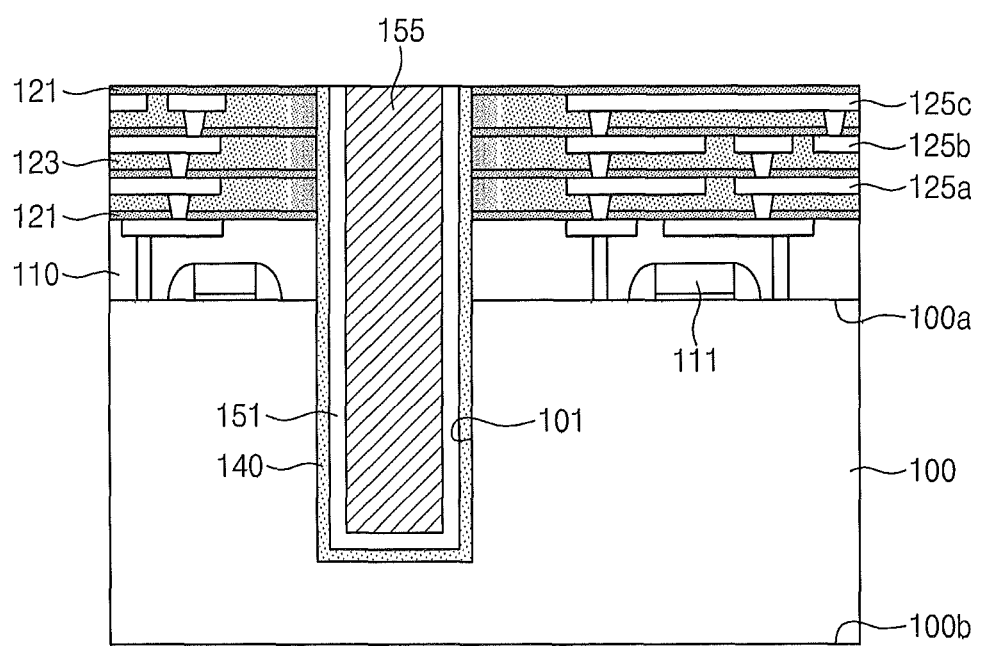

Referring to FIG. 3D, a via-dielectric layer 140 and a through-electrode 155 may be formed. The via-dielectric layer 140 may cover an inner surface of the via-hole 101, and a sidewall and a bottom surface of the through-electrode 155 may be surrounded by the via-dielectric layer 140. A barrier layer 151 may be further formed between the through-electrode 155 and the via-dielectric layer 140. Since the inner surface of the via-hole 101 may be uniformly hydrophobically treated by the recovery process, a deposition process of the via-dielectric layer 140 may be excellent.

Figure 3E:
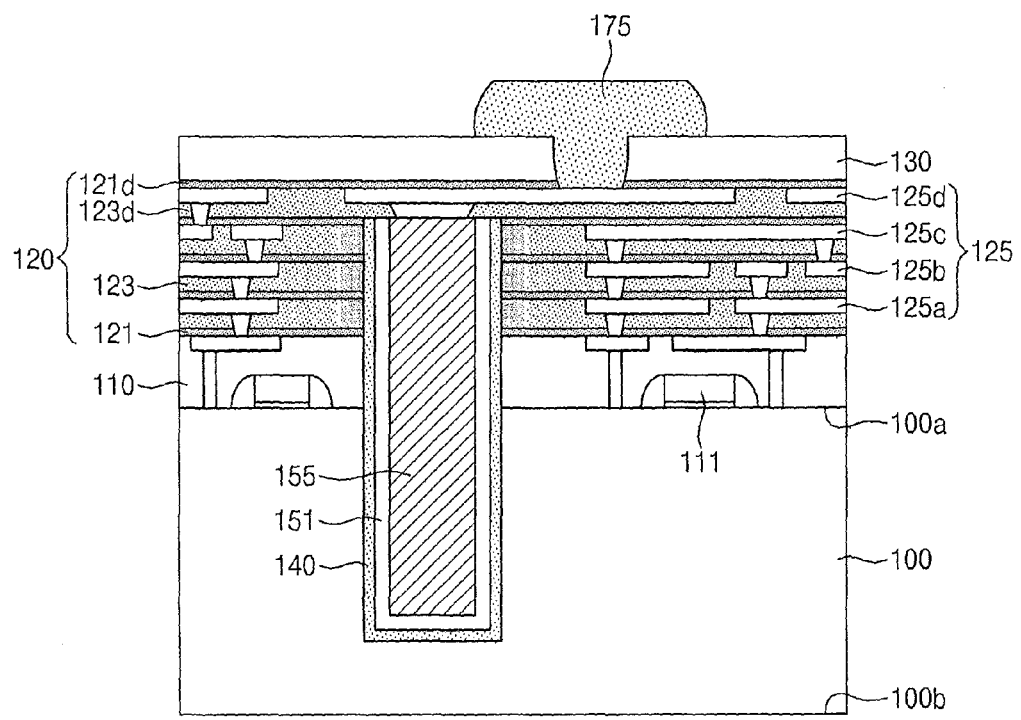

Referring to FIG. 3E, a fourth metal interconnection 125d and a low-k dielectric layer 123d may be formed on the semiconductor substrate 100. The fourth metal interconnection 125d may be electrically connected to the through-electrode 155 and may be disposed in the low-k dielectric layer 123d. An upper dielectric layer 130 may be formed on the fourth metal interconnection 125d, and a capping layer 121d may be formed between the upper dielectric layer 130 and the low-k dielectric layer 123d. The fourth metal interconnection 125d may be connected to the third metal interconnection 125c to electrically connect the through-electrode 155 to the integrated circuit 111. The first to fourth metal interconnections 125a to 125d may constitute a metal interconnection 125 having a multi-layered structure (e.g., a four-layered structure). The low-k dielectric layers 123 and 123d and the capping layers 121 and 121d may constitute an inter-metal dielectric layer 120.

An upper terminal 175 may be formed on the upper dielectric layer 130. The upper terminal 175 may penetrate the upper dielectric layer 130 so as to be electrically connected to the fourth metal interconnection 125d. In some embodiments, the upper terminal 175 may be formed in a redistribution pad shape.

Figure 3F:
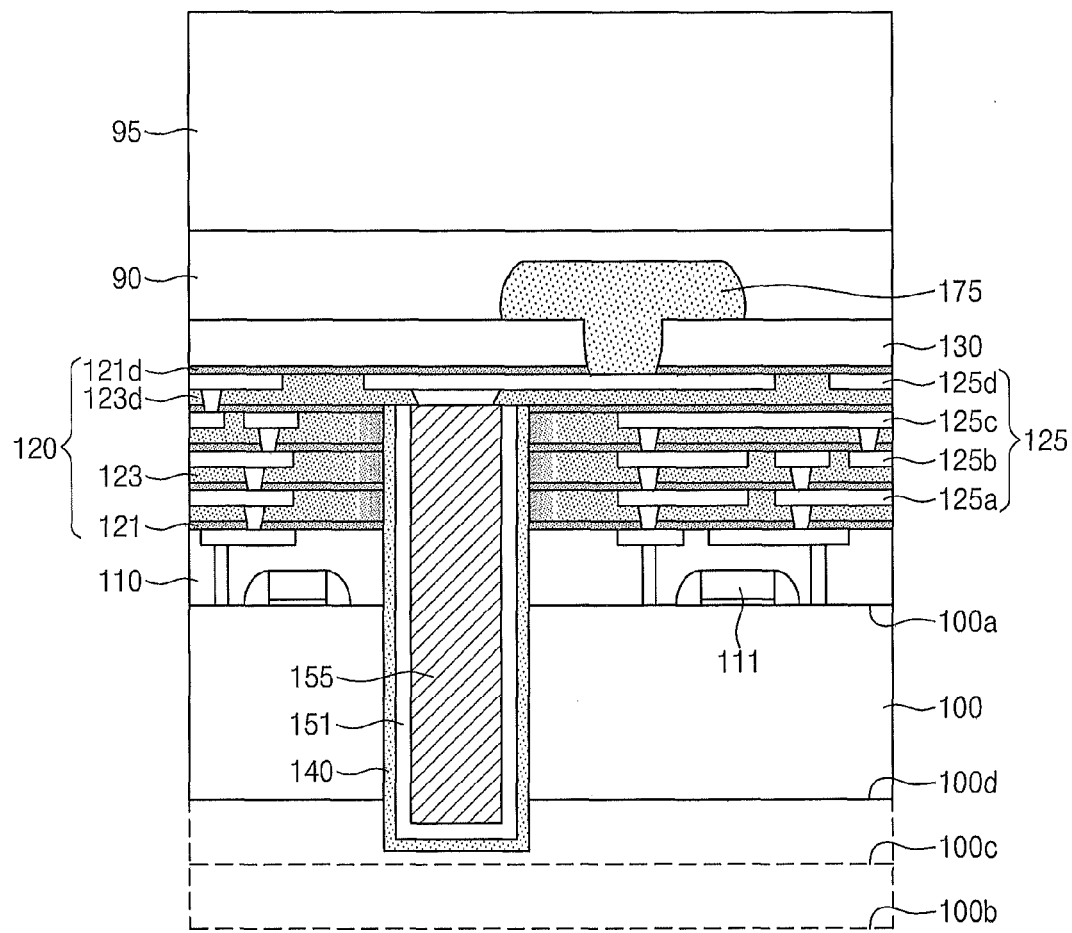

Referring to FIG. 3F, a carrier 95 may be adhered to the active surface 100a of the semiconductor substrate 100 by an adhesive layer 90, and the bottom surface 100b of the semiconductor substrate 100 may then be recessed such that the through-electrode 155 may protrude. In some embodiments, the bottom surface 100b of the semiconductor substrate 100 may be chemically-mechanically polished or grinded to emerge a second bottom surface 100c through which the through-electrode 155 is not exposed and then the second bottom surface 100c may be dry-etched or chemically-mechanically polished to expose an inactive surface 100d through which the through-electrode 155 is protruded.

Figure 3G:
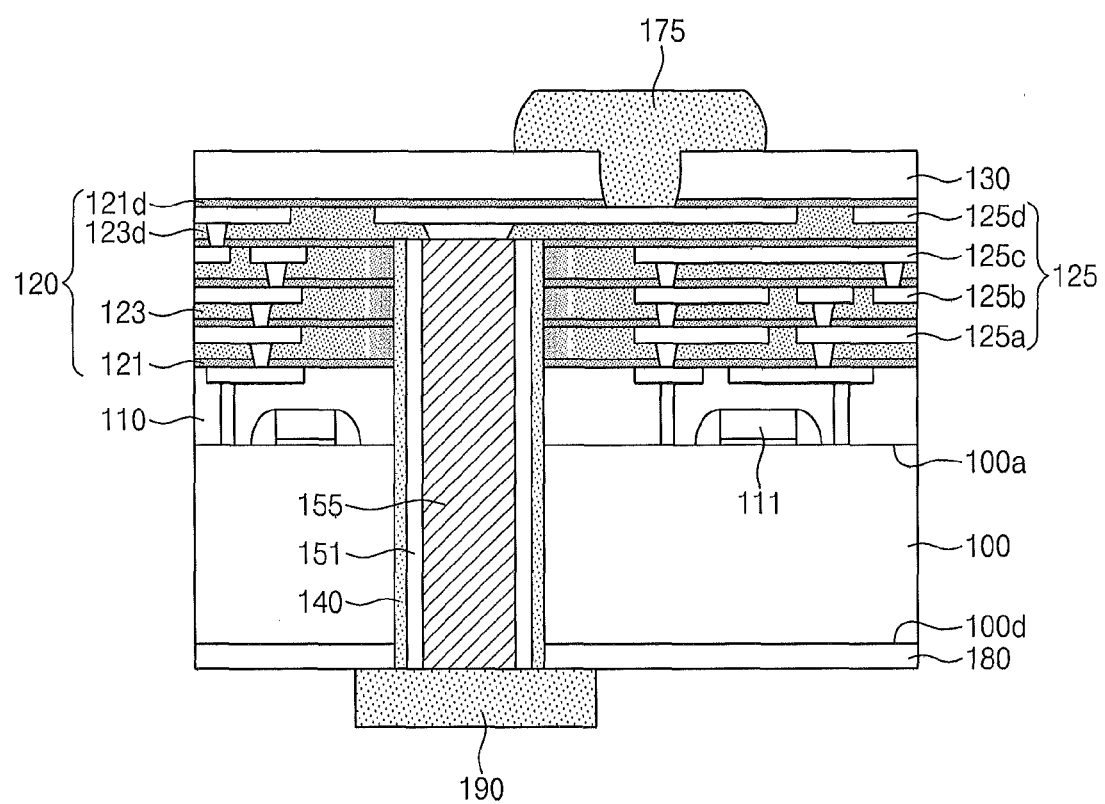

Referring to FIG. 3G, a silicon oxide layer or a silicon nitride layer may be deposited to cover the through-electrode 155 on the inactive surface 100d of the semiconductor substrate 100, and a chemical-mechanical polishing process may then be performed on the deposited silicon oxide layer or silicon nitride layer to form a planarized lower dielectric layer 180. Next, a lower terminal 190 electrically connected to the through-electrode 155 may be formed on the lower dielectric layer 180. The lower terminal 190 may have a pad-shape or a solder ball-shape. A semiconductor device 2 including the through-electrode 155 may be fabricated according to the embodiments described above.

Figure 4A:
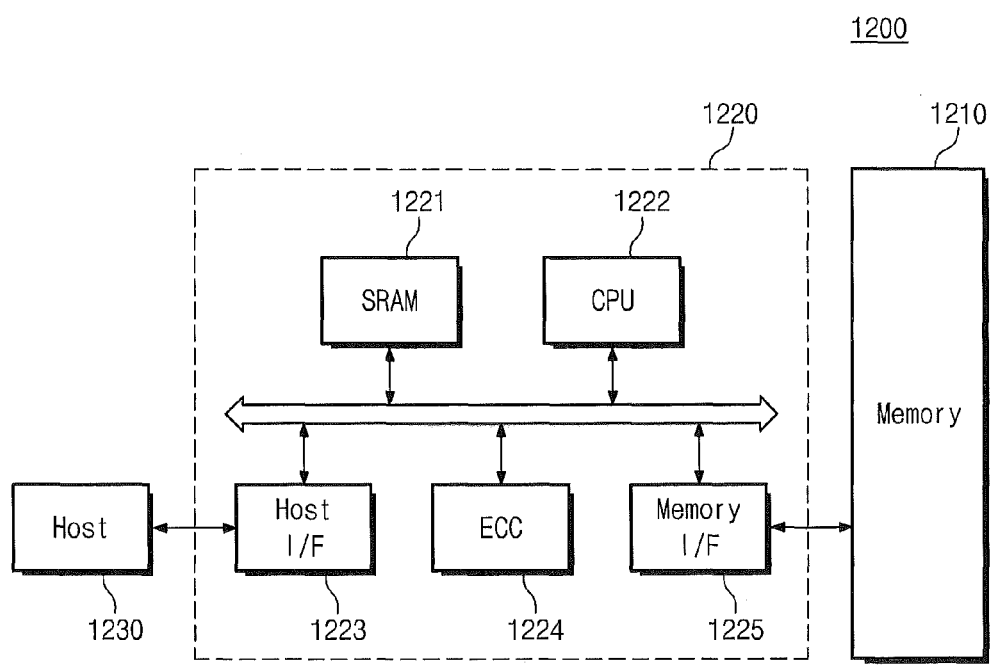
FIG. 4A is a schematic block diagram illustrating a memory card including a semiconductor device according to various embodiments of the present inventive concepts.
Figure 4B:
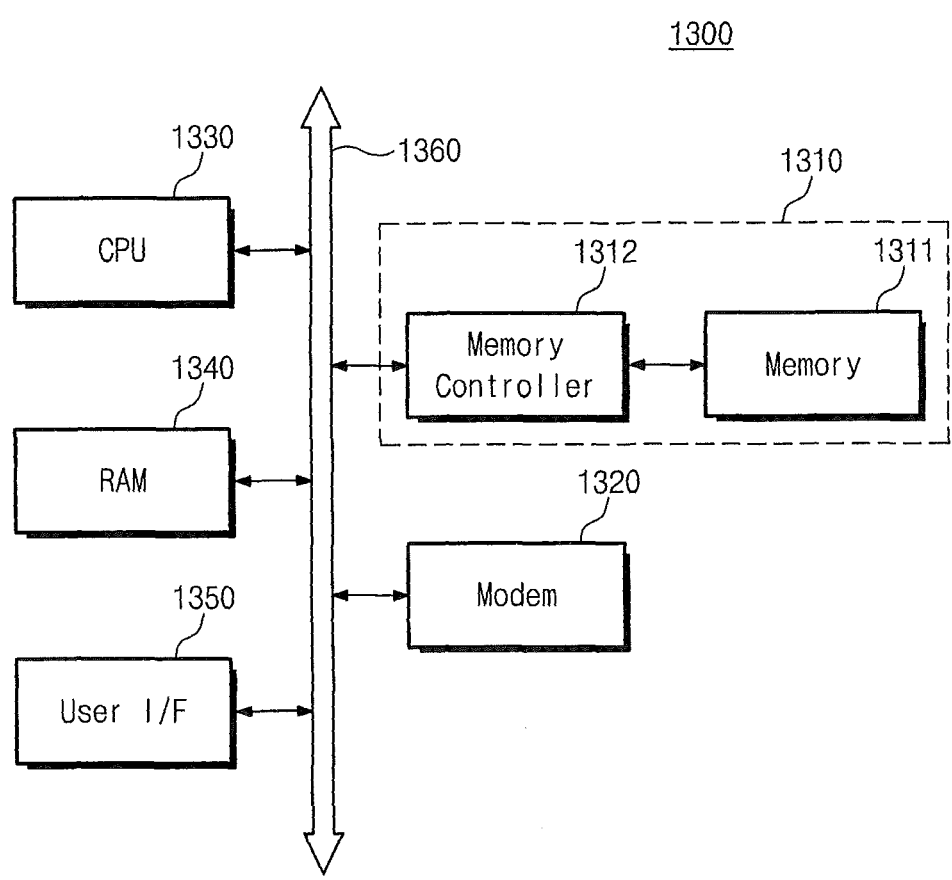
FIG. 4B is a schematic block diagram illustrating an information processing system applied with a semiconductor device according to various embodiments of the present inventive concepts.

FIG. 4A is a schematic block diagram illustrating a memory card including a semiconductor device according to some embodiments of the present inventive concepts. FIG. 4B is a schematic block diagram illustrating an information processing system applied with a semiconductor device according to some embodiments of the present inventive concepts.

Referring to FIG. 4A, a memory device 1210 including at least one of semiconductor devices 1 and 2 according to embodiments of the present inventive concepts may be applied to a memory card 1200. For example, the memory card 1200 may include a memory controller 1220 that controls data communication between a host 1230 and the memory device 1210. A static random access memory (SRAM) device 1221 may be used as a working memory of a central processing unit (CPU) 1222. A host interface unit 1223 may be configured to include a data communication protocol between the memory card 1200 and the host 1230. An error check and correction (ECC) block 1224 may detect and correct errors of data which are read out from the memory device 1210. A memory interface unit 1225 may interface with the memory device 1210. The CPU 1222 controls an overall operation of the memory controller 1220. The CPU 1222 may include at least one of the semiconductor devices 1 and 2 according to embodiments of the present inventive concepts.

Referring to FIG. 4B, an information processing system 1300 may include a memory system 1310 including at least one of the semiconductor devices 1 and 2 according to embodiments of the present inventive concepts. The information processing system 1300 may include a mobile device or a computer. For example, the information processing system 1300 may include a modem 1320, a central processing unit (CPU) 1330, a random access memory (RAM) 1340, and a user interface unit 1350 that are electrically connected to the memory system 1310 through a system bus 1360. The memory system 1310 may include a memory device 1311 and a memory controller 1312. The memory system 1310 may have substantially the same structure as the memory card 1200 illustrated FIG. 4A. At least one of the CPU 1330 and the RAM 1340 may include at least one of the semiconductor devices 1 and 2 according to embodiments of the present inventive concepts.

The memory system 1310 may store data processed by the CPU 1330 or data inputted from an external system. The information processing system 1300 may be realized as a memory card, a solid state disk (SSD) device, a camera image sensor, and/or another type of application chipset. For example, if the memory system 1310 is realized as the SSD device, the information processing system 1300 may stably and reliably store massive data.

As described above, by an etching process and/or ashing process for the formation of a via-hole, an inter-metal dielectric layer may be damaged and/or carbon loss may occur in the inter-metal dielectric layer. According to some embodiments of the present inventive concepts, by performing a recovery process as described herein, the inter-metal dielectric layer may be supplemented with carbon and/or the low-k characteristic of the inter-metal dielectric layer may be maintained. Some embodiments provide that, after a recovery process as described herein, the inter-metal dielectric layer may have a hydrophobic property and/or resistance to a DHF strip process. In some embodiments, a recovery process as described herein may allow for the low-k dielectric layer to not be removed after a DHF strip process and/or for the low-k characteristic of the inter-metal dielectric layer to be maintained after a DHF strip process. In some embodiments, a recovery process as described herein may allow for a DHF strip process to be skipped and/or to be unnecessary. Thus, the integrity of the semiconductor device may be secured and/or the electrical characteristics of the semiconductor device may be improved. In some embodiments, a surface of a semiconductor substrate exposed by the via-hole may have a hydrophobic property due to the recovery process, so the DHF strip process may be skipped. In some embodiments, a low-temperature $CO_2$ ashing process may be performed to minimize damage of the low-k dielectric layer. Some embodiments provide that fabricating processes of the semiconductor device may be simplified.

While the present inventive concepts have been described with reference to example embodiments, it will be apparent to those skilled in the art that various changes and modifications may be made without departing from the spirits and scopes of the present inventive concepts. Therefore, it should be understood that the above embodiments are not limiting, but illustrative. Thus, the scopes of the present inventive concepts are to be determined by the broadest permissible interpretation of the following claims and their equivalents, and shall not be restricted or limited by the foregoing description.

What is claimed is:

1. A method for fabricating a semiconductor device, the method comprising:
    forming an inter-metal dielectric layer including a plurality of dielectric layers on a substrate;
    forming a via-hole vertically penetrating the inter-metal dielectric layer and the substrate;
    contacting a gas including carbon and at least one of silicon (Si), hydrogen (H), oxygen (O) and nitrogen (N) to at least one surface of the inter-metal dielectric layer exposed by the via-hole and to a surface of the substrate exposed by the via-hole;
    forming a via-dielectric layer covering an inner surface of the via-hole; and
    forming a through-electrode surrounded by the via-dielectric layer in the via-hole.

2. The method of claim 1, wherein forming the inter-metal dielectric layer comprises:
    stacking a capping layer between each of the plurality of dielectric layers, the plurality of dielectric layers including low-k dielectric layers, to form on the substrate a plurality of alternately stacked low-k dielectric layers and capping layers,
    wherein the low-k dielectric layers have a dielectric constant lower than that of silicon dioxide.

3. The method of claim 2, wherein the capping layers include SiCN and the low-k dielectric layers include SiCOH.

4. The method of claim 3, wherein surfaces of the low-k dielectric layers are contacted with the gas and Si—OH bonds in the low-k dielectric layers are substituted with Si—CH$_3$ bonds by contacting the surfaces of the low-k dielectric layers with the gas.

5. The method of claim 3, wherein surfaces of the low-k dielectric layers are hydrophobically treated by contacting the surfaces of the low-k dielectric layers with the gas.

6. The method of claim 1, wherein the surface of the substrate exposed by the via-hole is hydrophobically treated by contacting the surface of the substrate with the gas.

7. The method of claim 1, wherein forming the via-hole comprises:
    forming a mask layer on the inter-metal dielectric layer;
    patterning the inter-metal dielectric layer and the substrate to form the via-hole by an etching process using the mask layer as an etch mask; and
    removing the mask layer by an ashing process using a gas including CO, $CO_2$, $N_2/H_2$, $O_2$, or any combination thereof at a temperature of about 200° C. or less.

8. The method of claim 1, wherein the at least one surface of the inter-metal dielectric layer exposed by the via-hole is
    hydrophobically treated by contacting the at least one surface of the inter-metal dielectric layer exposed by the via-hole with the gas.

9. The method of claim 1, wherein forming the via-hole comprises:
    forming a vertical hole completely penetrating the inter-metal dielectric layer and partially penetrating the substrate by an etching process.

10. The method of claim 1, further comprising, before and/or after contacting the gas including carbon and at least one of silicon (Si), hydrogen (H), oxygen (O) and nitrogen (N) to the at least one surface of the inter-metal dielectric layer exposed by the via-hole and to the surface of the substrate exposed by the via-hole, contacting the via-hole with diluted hydrofluoric acid (DHF) to hydrophobically treat the surface of the substrate exposed by the via-hole.

11. The method of claim 1, wherein the gas comprises SiC, SiCO, SiCN, or any combination thereof.

12. A semiconductor device comprising:
    an integrated circuit on the substrate;
    the inter-metal dielectric layer including at least one metal interconnection electrically connected to the integrated circuit; and
    the through-electrode vertically penetrating the inter-metal dielectric layer and the substrate,
    wherein the inter-metal dielectric layer comprises a carbon-containing low-k dielectric layer having a dielectric constant lower than that of silicon dioxide,
    wherein the low-k dielectric layer comprises a surface adjacent to the through-electrode and a bulk distal to the through-electrode in a horizontal direction, and
    wherein the low-k dielectric layer comprises Si—CH$_3$ bonds having hydrophobic properties, a carbon concentration of the low-k dielectric layer becoming reduced and then increased from the surface of the low-k dielectric layer toward the bulk of the low-k dielectric layer.

13. The semiconductor device of claim 12, wherein the carbon concentration of the low-k dielectric layer comprises:
    a first concentration at the surface of the low-k dielectric layer;
    a second concentration in a surface-nearby region adjacent to the surface of the low-k dielectric layer, the second concentration lower than the first concentration; and
    a third concentration in the bulk, the third concentration higher than the second concentration.

14. The semiconductor device of claim 13, wherein the first concentration is equal to or higher than the third concentration.

15. The semiconductor device of claim 12, wherein the inter-metal dielectric layer further comprises an insulating capping layer covering the low-k dielectric layer.

16. The semiconductor device of claim 15, wherein the low-k dielectric layer includes SiCOH and the insulating capping layer includes SiCN.

17. A method comprising:
providing a semiconductor substrate including at least one dielectric layer and a via-hole vertically penetrating the at least one dielectric layer and the semiconductor substrate, the at least one dielectric layer having a first portion exposed by the via-hole with a first concentration of carbon and a second portion with a second concentration of carbon, wherein the first concentration is less than the second concentration; and
adding carbon to at least the first portion of the at least one dielectric layer by contacting a gas including carbon and at least one of silicon (Si), oxygen (O) and nitrogen (N) to the at least the first portion of the at least one dielectric layer, wherein adding carbon to the at least the first portion of the at least one dielectric layer is carried out at a temperature in a range of about 200° C. to about 500° C. in an oxidation or inert atmosphere.

18. The method of claim 17, wherein adding carbon to the at least the first portion of the at least one dielectric layer comprises converting a hydrophilic property in the first portion to a hydrophobic property.

19. The method of claim 18, wherein the hydrophilic property includes a SiOH bond and the hydrophobic property includes a Si—CH$_3$ bond.

20. The method of claim 17, wherein the gas comprises SiC, SiCO, SiCN, or any combination thereof.

* * * * *